(12) United States Patent
Bhuiyan et al.

(10) Patent No.: US 9,483,096 B2
(45) Date of Patent: Nov. 1, 2016

(54) HOST INTERFACE OF A MEMORY DEVICE SUPPLIED WITH REGULATED OR NON-REGULATED POWER BASED ON OPERATING MODE OF THE MEMORY DEVICE

(71) Applicant: SANDISK TECHNOLOGIES INC., Plano, TX (US)

(72) Inventors: Ekram Hossain Bhuiyan, San Jose, CA (US); Steve Xiaofeng Chi, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 93 days.

(21) Appl. No.: 14/099,372

(22) Filed: Dec. 6, 2013

(65) Prior Publication Data
US 2015/0160706 A1    Jun. 11, 2015

(51) Int. Cl.
| | |
|---|---|
| *G06F 1/26* | (2006.01) |
| *G06F 1/32* | (2006.01) |
| *G11C 16/30* | (2006.01) |
| *G06F 13/16* | (2006.01) |

(52) U.S. Cl.
CPC .............. *G06F 1/266* (2013.01); *G06F 1/3225* (2013.01); *G06F 1/3275* (2013.01); *G06F 1/3296* (2013.01); *G06F 13/1668* (2013.01); *G11C 16/30* (2013.01); *Y02B 60/1228* (2013.01); *Y02B 60/1285* (2013.01)

(58) Field of Classification Search
CPC ... G06F 1/3203; G06F 1/3268; G06F 1/3275
USPC ........................................................ 713/323
See application file for complete search history.

(56) References Cited

U.S. PATENT DOCUMENTS

| | | | |
|---|---|---|---|
| 6,140,805 A | 10/2000 | Kaneko et al. | |
| 6,434,044 B1 | 8/2002 | Gongwer et al. | |
| 6,742,130 B1* | 5/2004 | Kawase | B41J 29/393 710/14 |
| 7,675,802 B2* | 3/2010 | Kagan | G11C 5/147 365/189.08 |
| 8,996,892 B1* | 3/2015 | Chu | G06F 1/325 710/62 |
| 2003/0011313 A1* | 1/2003 | Ishizuka | G11C 8/12 315/169.1 |
| 2003/0182588 A1* | 9/2003 | Dodd | G06F 1/3225 713/300 |
| 2005/0041509 A1* | 2/2005 | Kumahara | G11C 16/30 365/226 |

(Continued)

OTHER PUBLICATIONS

International Search Report and Written Opinion of the International Searching Authority for International Application No. PCT/US2014/067346, mailed Mar. 4, 2015, 9 pages.

(Continued)

*Primary Examiner* — Thomas Lee
*Assistant Examiner* — Santosh R Poudel
(74) *Attorney, Agent, or Firm* — Toler Law Group, PC

(57) ABSTRACT

A data storage device includes a non-volatile memory and a host interface. A method includes supplying a first supply voltage to the host interface during a first mode of operation of the non-volatile memory. The method further includes supplying a second supply voltage to the host interface in response to a transition from the first mode of operation to a second mode of operation of the non-volatile memory.

22 Claims, 4 Drawing Sheets

(56) References Cited

U.S. PATENT DOCUMENTS

| | | | |
|---|---|---|---|
| 2006/0168464 A1* | 7/2006 | Yuasa | G06F 1/3203 713/340 |
| 2006/0198225 A1* | 9/2006 | Spengler | G06F 1/3203 365/222 |
| 2009/0158058 A1* | 6/2009 | Lin | G06F 1/266 713/300 |
| 2010/0115314 A1* | 5/2010 | Sultenfuss | G06F 1/3203 713/323 |
| 2010/0188920 A1* | 7/2010 | Futatsuyama | G11C 16/30 365/226 |
| 2011/0058439 A1* | 3/2011 | Lee | G11O 5/14 365/227 |
| 2011/0309679 A1 | 12/2011 | Fisher et al. | |
| 2012/0089766 A1 | 4/2012 | Yu et al. | |
| 2012/0226927 A1 | 9/2012 | Kagan et al. | |
| 2013/0076421 A1* | 3/2013 | Priel | H03K 3/012 327/215 |
| 2014/0016425 A1* | 1/2014 | Lee | G05F 1/10 365/226 |

OTHER PUBLICATIONS

International Preliminary Report on Patentability for International Application No. PCT/US2014/067346, mailed Jun. 16, 2016, 6 pages.

* cited by examiner

HOST INTERFACE OF A MEMORY DEVICE SUPPLIED WITH REGULATED OR NON-REGULATED POWER BASED ON OPERATING MODE OF THE MEMORY DEVICE

FIELD OF THE DISCLOSURE

The present application is generally related to data storage devices and more particularly to power management of data storage devices.

BACKGROUND

Non-volatile data storage devices, such as embedded memory devices and removable memory devices, have enabled increased portability of data and software applications. For example, multi-level cell (MLC) storage elements of a flash memory device may each store multiple bits of data, enhancing data storage density as compared to single-level cell (SLC) flash memory devices. As a result, flash memory devices may enable users to store and access a large amount of data. Further, consumer demand for power-efficient and compact portable electronic devices has resulted in smaller devices with longer battery life. However, design and manufacture of electronic devices with large storage capacity, low power consumption, and small form factor may pose engineering challenges.

For example, an integrated circuit of a portable electronic device may include multiple voltage domains in order to reduce power consumption of the portable electronic device, such as by using a reduced supply voltage for certain portions of the integrated circuit that are configured to operate using the reduced supply voltage. However, using multiple voltage domains may increase size and complexity of the integrated circuit, such as by increasing a number of input terminals or a number of voltage regulators of the integrated circuit.

SUMMARY

A data storage device includes a non-volatile memory and a controller coupled to the non-volatile memory. The non-volatile memory may include an interface to the controller, and the controller may include an interface to a host device that accesses the data storage device. To simplify design of the data storage device, some configurations use a common supply voltage for both of the interfaces. However, operation of one of the interfaces (e.g., switching on and off) may degrade performance at the other interface by creating noise. Further, in certain configurations, the interfaces may be configured to operate using "clean" or un-noisy supply voltages. As a particular example, a Universal Flash Storage communication protocol may specify that a supply voltage of the interface to the host device is to be within a specific operating range that should not be corrupted by noise.

Certain data storage devices utilize a regulator, such as a linear voltage regulator, to generate a supply voltage for the interface to the controller instead of "sharing" a common supply voltage for both of the interfaces. The regulator may consume power. For example, certain data storage devices may regulate a 3.3 volt supply voltage that powers a memory array of the non-volatile memory to generate a 1.8 volt supply voltage for the interface to the controller. The regulator consumes power, which may result in poor power management and abbreviated battery life of a portable electronic device.

An example supply voltage delivery technique in accordance with the present disclosure selectively powers the interface to the host device using either a first supply voltage, such as a regulated supply voltage, or a second supply voltage, such as an unregulated supply voltage, depending on a particular mode of operation of the non-volatile memory. For example, the interface to the host device may be supplied with the regulated supply voltage when the non-volatile memory is operating according to an active mode of operation in which data is written to or accessed from the non-volatile memory in order to reduce noise associated with writing or accessing of data at the non-volatile memory. The interface to the host device may be supplied with the unregulated supply voltage while the non-volatile memory is to operate according to a standby mode of operation (e.g., while the non-volatile memory is inactive). Selectively powering the interface to the host device according to the supply voltage delivery technique may reduce noise at the interface, such as by regulating the supply voltage to the interface while the non-volatile memory is active, while also reducing power consumption (such as by supplying the interface with an unregulated supply voltage while the non-volatile memory is inactive).

In addition, selectively powering the interface to the host device using either the regulated supply voltage or the unregulated supply voltage may enable one or more components of the data storage device to be powered down. To illustrate, the regulated supply voltage may be generated by a regulator that tracks a supply voltage to the non-volatile memory. When the unregulated supply voltage is provided to the interface to the host device, the supply voltage to the non-volatile memory may be disconnected from the non-volatile memory. Disconnecting the supply voltage to the non-volatile memory in such a manner reduces power consumption (e.g., leakage power) at the data storage device.

DETAILED DESCRIPTION

Figure 1:
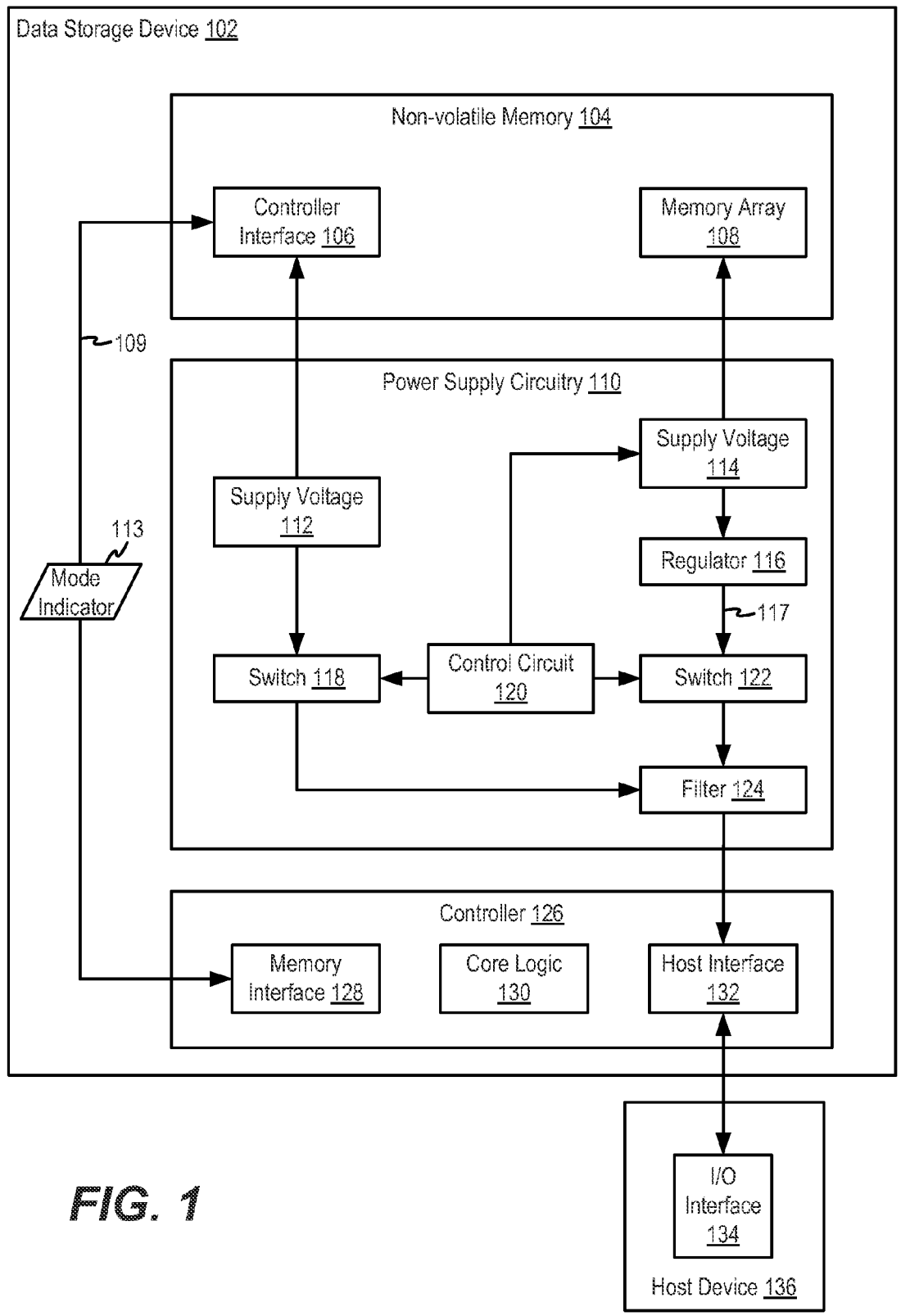
FIG. 1 is a diagram of a particular illustrative embodiment of an electronic device that includes a data storage device.

Referring to FIG. 1, a particular illustrative embodiment of an electronic device is depicted and generally designated 100. The electronic device 100 includes a data storage device 102 and a host device 136. The data storage device 102 may be embedded within the host device 136, such as in accordance with a Joint Electron Devices Engineering Council (JEDEC) Solid State Technology Association Universal Flash Storage (UFS) configuration. Alternatively, the data storage device 102 may be removable from (i.e., "removably" coupled to) the host device 136. For example, the data storage device 102 may be removably coupled to the host device 136 in accordance with a removable universal serial bus (USB) configuration.

The data storage device 102 includes a non-volatile memory 104, power supply circuitry 110, and a controller 126. Although the particular example of FIG. 1 depicts that the power supply circuitry 110 is external to the controller 126, it should be appreciated that the power supply circuitry 110 (or one or more components thereof) may be embedded within the controller 126. One or more components of the data storage device 102 may be coupled via one or more buses or other structures. As an example, the non-volatile memory 104 may be coupled to the controller 126 via a connection 109.

The non-volatile memory 104 may include a controller interface 106 and a memory array 108. The controller interface 106 may be configured to communicate with the controller 126 via the connection 109. The connection 109 may include a bus, another structure, or a combination thereof.

The power supply circuitry 110 may include a switch 118, a control circuit 120, a regulator 116, a switch 122, and a filter 124. The switch 118 may be responsive to a supply voltage 112. The regulator 116 is responsive to a supply voltage 114 and is configured to generate a regulated supply voltage 117. The supply voltage 114 may be an unregulated supply voltage. The regulator 116 may be responsive to the unregulated supply voltage and may be configured to track the unregulated supply voltage to generate the regulated supply voltage 117. In a particular embodiment, the supply voltage 112 is approximately 1.8 volts, the supply voltage 114 is approximately 3.3 volts, and the regulated supply voltage 117 is approximately 1.8 volts.

In a particular embodiment, one or more of the switches 118, 122 include one or more transistors, such as p-type metal-oxide-semiconductor field-effect transistors (pMOSFETs). The pMOSFETs may be of a large size to enable low resistance and/or to accommodate a large range of voltage levels of the supply voltages 112, 114. The control circuit 120 may be configured to selectively activate and deactivate the switches 118, 122. As a particular example, the switch 118 may include a pMOSFET that is activated by an enable signal generated by the control circuit 120, and the switch 122 may include a pMOSFET that is deactivated by a complement of the enable signal. The control circuit 120 may include an inverter to generate the complement of the enable signal. Alternatively or in addition, the control circuit 120 and the switches 118, 122 may include one or more other components.

The controller 126 may include a memory interface 128, core logic 130, and a host interface 132. The memory interface 128 may be configured to communicate with the controller interface 106 via the connection 109. The memory interface 128 and the core logic 130 may be supplied with an appropriate supply voltage. For example, the memory interface 128 may be supplied with the supply voltage 112, or another supply voltage. The core logic 130 may be supplied with a core supply voltage (not shown in FIG. 1), or another supply voltage. The host interface 132 may be selectively supplied with the supply voltage 112 or with the regulated supply voltage 117 via the filter 124, as described further below.

The controller 126 is configured to receive data and instructions from the host device 136 and to send data to the host device 136. For example, the controller 126 may send data to the host device 136 via the host interface 132 and may receive data from the host device 136 via the host interface 132. The controller 126 may store (e.g., buffer) data at a cache or a memory, such as a random access memory (RAM) included in the core logic 130.

The controller 126 is configured to send data and commands to the non-volatile memory 104 via the connection 109 and to receive data from the non-volatile memory 104 via the connection 109. For example, the controller 126 is configured to send data and a write command to cause the non-volatile memory 104 to store the data to a specified address of the non-volatile memory 104. The controller 126 may send to the memory array 108 one or more error correcting code (ECC) codewords generated by an ECC encoder of the core logic 130.

The controller 126 is configured to send a read command via the connection 109 to sense data from a specified address of the non-volatile memory 104. As an example, the controller 126 may send a read command to sense data stored at the memory array 108. The core logic 130 may include an ECC decoder that is configured to decode the data sensed from the memory array 108.

The host device 136 may include an input/output (I/O) interface 134. The I/O interface 134 may be configured to communicate with the host interface 132. In a particular embodiment, the host interface 132 and the I/O interface 134 are compliant with an embedded flash drive (EFD) configuration, such a Universal Flash Storage (UFS) communication protocol. For example, the host interface 132 and the I/O interface 134 may include an "M-PHY" physical interface defined by the UFS communication protocol.

The host device 136 may correspond to a mobile telephone, a music player, a video player, a gaming console, an electronic book reader, a personal digital assistant (PDA), a computer, such as a laptop computer, tablet, or notebook computer, another electronic device, or a combination thereof. The host device 136 may communicate via a host controller, which may enable the host device 136 to read data from the non-volatile memory 104 and to write data to the non-volatile memory 104. The host device 136 may operate in compliance with a JEDEC Solid State Technology Association industry specification, such as an embedded MultiMedia Card (eMMC) specification or a Universal Flash Storage (UFS) Host Controller Interface specification. The host device 136 may operate in compliance with one or more other specifications, such as a Secure Digital (SD) Host Controller specification as an illustrative example. Alternatively, the host device 136 may communicate with the non-volatile memory 104 in accordance with another suitable communication protocol.

In operation, the non-volatile memory 104 may be configured to operate in one or more modes of operation. The non-volatile memory 104 may be responsive to commands issued by the memory interface 128 via the connection 109 that specify a mode of operation of the non-volatile memory 104. As a particular illustrative example, the memory interface 128 may issue a mode indicator 113 to the controller interface 106 via the connection 109. The mode indicator 113 may instruct the non-volatile memory 104 to operate according to one or more modes of operation. For example, the mode indicator 113 may instruct the non-volatile memory 104 to operate according to a first mode of operation, such as an active mode of operation in which data is written to or accessed from the non-volatile memory 104. As another example, the mode indicator 113 may instruct the non-volatile memory 104 to operate according to a second mode of operation, such as a standby mode of operation (e.g., a low-power mode of operation initiated in response to inactivity of the non-volatile memory 104 during which the controller 126 is not accessing the memory array 108).

The control circuit 120 may be responsive to a transition of a mode of operation of the non-volatile memory 104. For example, as described further with reference to FIG. 2, the control circuit 120 may be coupled to the connection 109, and the control circuit 120 may be responsive to the mode indicator 113. As another example, the control circuit 120 may include a voltage detector that is responsive to the supply voltage 112, as described further with reference to FIG. 3. In either case, the control circuit 120 may be responsive to the transition of the mode of operation of the non-volatile memory 104.

In response to the transition of the mode of operation of the non-volatile memory 104, the control circuit 120 may change or select a supply voltage that is supplied to the host interface 132. For example, the control circuit 120 may activate the switch 118 to cause the supply voltage 112 to be supplied to the host interface 132 via the filter 124. As another example, the control circuit 120 may activate the switch 122 to supply the host interface 132 with the regulated supply voltage 117 via the filter 124. The control circuit 120 may selectively activate the switches 118, 122 based on a mode of operation of the non-volatile memory 104, such as an active mode of operation or a standby mode of operation, enabling selective supply voltage delivery to the host interface 132.

In a particular embodiment, a first voltage level of the regulated supply voltage 117 (e.g., a regulated voltage level) is approximately equal to a second voltage level of the supply voltage 112 (e.g., an unregulated voltage level). Setting the first voltage level to be approximately equal to the second voltage level reduces a transition noise associated with switching between the supply voltage 112 and the regulated supply voltage 117, such as by eliminating (or reducing) voltage "swings" during switching between the supply voltage 112 and the regulated supply voltage 117. As a particular example, the first voltage level and the second voltage level may each be approximately 1.8 volts.

The supply voltage delivery techniques described in connection with FIG. 1 may enable improved power management at the data storage device 102 while reducing noise at the host interface 132. For example, the power supply circuitry 110 may supply the host interface 132 with the regulated supply voltage 117 when noise is expected at the supply voltage 112, such as during an active mode of operation of the non-volatile memory 104. The power supply circuitry 110 may supply the host interface 132 with the supply voltage 112 while noise is not expected at the supply voltage 112, such as when the non-volatile memory 104 is to operate according to a standby mode of operation. Selectively powering the host interface 132 in such a manner may reduce noise at the host interface 132 while also reducing power consumption at the data storage device 102. For example, the supply voltage delivery techniques of FIG. 1 may reduce power consumption compared to a device that provides a regulated supply voltage to an interface during both active and standby modes of operation of a non-volatile memory.

Figure 2:
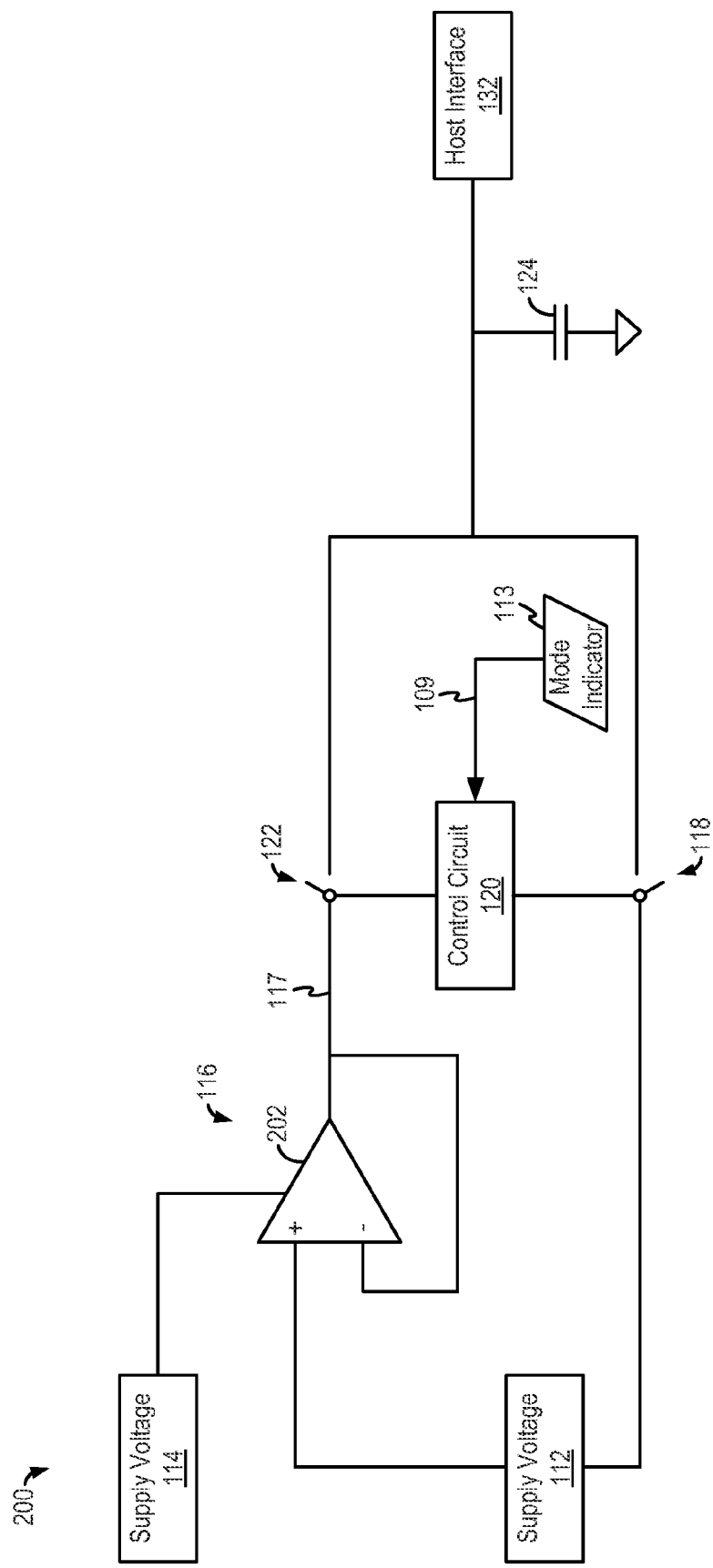
FIG. 2 is a diagram of a circuit that may be included in the data storage device of FIG. 1.

Referring to FIG. 2, a particular illustrative embodiment of a circuit is depicted and generally designated 200. In a particular embodiment, the circuit 200 is included in the data storage device 102.

The circuit 200 may include the regulator 116. In the example of FIG. 2, the regulator 116 includes an operational amplifier (op-amp) 202 having a first input (e.g., a non-inverting input) that is responsive to a reference voltage, such as the supply voltage 112. The op-amp 202 may further have a second input (e.g., an inverting input) that is responsive to a negative feedback voltage, such as the regulated supply voltage 117. The op-amp 202 may be powered by the supply voltage 114. It should be appreciated that the configuration depicted in FIG. 2 is illustrative and that the regulator 116 may be implemented using one or more other circuits alternatively or in addition to the particular example of FIG. 2.

The circuit 200 may further include the control circuit 120, the switch 118, and the switch 122. The control circuit 120 may be coupled to the connection 109. For example, the control circuit 120 may be configured to receive the mode indicator 113 via the connection 109. The circuit 200 may further include the filter 124 and the host interface 132. The filter 124 may include a capacitive filter, such as a capacitor, as illustrated in FIG. 2.

In operation, the op-amp 202 may be responsive to the supply voltages 112, 114 to generate the regulated supply voltage 117. The op-amp 202 may use the supply voltage 112 as a reference input. The op-amp 202 may use the regulated supply voltage 117 as a negative feedback input. The op-amp 202 may be powered by the supply voltage 114. The op-amp 202 may regulate the supply voltage 114 by comparing the reference input and the negative feedback input, generating the regulated supply voltage 117. As a particular illustrative example, the supply voltage 114 may be approximately 3.3 volts, the supply voltage 112 may be approximately 1.8 volts, and the regulated supply voltage 117 may be approximately 1.8 volts.

The control circuit 120 may selectively activate and deactivate the switches 118, 122 to supply the host interface 132 with the regulated supply voltage 117 or the supply voltage 112. For example, the control circuit 120 may activate the switch 122 to provide the regulated supply voltage 117 to the host interface 132 in response to the mode indicator 113 indicating that the non-volatile memory 104 is to operate according to an active mode of operation. The control circuit 120 may deactivate the switch 118 in response to the mode indicator 113 indicating that the non-volatile memory 104 is to operate according to the active mode of operation. As another example, the control circuit 120 may activate the switch 118 to supply the supply voltage 112 to the host interface 132 in response to the mode indicator 113 indicating that the non-volatile memory 104 is to operate according to a standby mode of operation. The control circuit 120 may deactivate the switch 122 in response to the mode indicator 113 indicating that the non-volatile memory 104 is to operate according to the standby mode of operation.

The control circuit 120 may control the switches 118, 122 synchronously or approximately synchronously (e.g., one of the switches 118, 122 may be activated at approximately the same time that the other of the switches 118, 122 is deactivated). Alternatively, one of the switches 118, 122 may be activated slightly before the other of the switches 118, 122 is deactivated, such as to reduce or prevent capacitive charging and/or discharge of one or more components (e.g., discharge of a capacitive charge stored at the filter 124).

The circuit 200 may improve power management at a data storage device. For example, because the supply voltage 114 supplies the memory array 108 as illustrated in FIG. 1, the supply voltage 114 may be disconnected or disabled (e.g., by the control circuit 120) during the standby mode of operation of the non-volatile memory 104. Disabling the supply voltage 114 in such as manner does not disrupt operation of the host interface 132 because the host interface 132 is supplied by the supply voltage 112 during the standby mode of operation. Thus, power savings can be increased by providing the supply voltage 112 to the host interface 132 and disconnecting the supply voltage 114 during the standby mode of operation. The power savings can improve battery life of an electronic device that includes the data storage device 102 (e.g., an electronic device in which the data storage device 102 is embedded, such as in connection with a UFS configuration).

Figure 3:
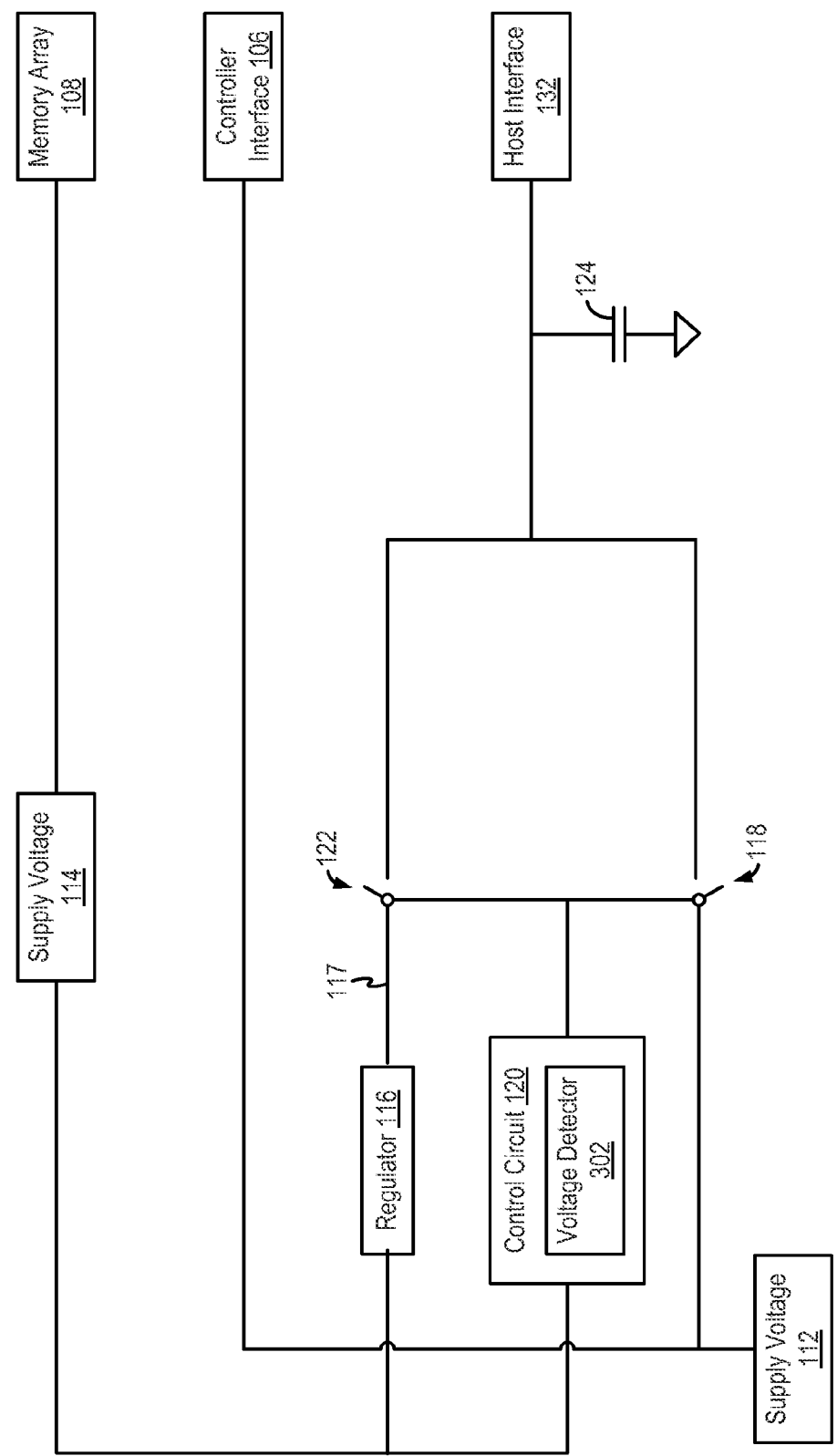
FIG. 3 is a diagram of another circuit that may be included in the data storage device of FIG. 1.

Referring to FIG. 3, a particular illustrative embodiment of a circuit is depicted and generally designated 300. In a particular illustrative embodiment, the circuit 300 is included in the data storage device 102.

The circuit 300 may include the regulator 116, the control circuit 120, the switches 118, 122, the filter 124, the memory array 108, the controller interface 106, and the host interface 132. The regulator 116 may be responsive to the supply voltage 114 to generate the regulated supply voltage 117. The controller interface 106 may be responsive to the supply voltage 112.

The control circuit 120 may include a voltage detector 302. The voltage detector 302 may be responsive to the supply voltage 114. As a particular example, the voltage detector 302 may be configured to selectively activate and deactivate the switches 118, 122 based on the supply voltage 114.

In operation, the voltage detector 302 may detect a voltage level of the supply voltage 114. If the voltage detector 302 detects that the supply voltage 114 satisfies a threshold (e.g., is within a particular operating range), the voltage detector 302 may determine that the non-volatile memory 104 is to operate according to a first mode of operation. The first mode of operation may correspond to an active mode of operation. If the voltage detector 302 detects that the supply voltage 114 does not satisfy the threshold (e.g., in response to a power-down event, such as initiation of a standby mode of operation), the voltage detector 302 may determine that the non-volatile memory is to operate according to a standby mode of operation.

The voltage detector 302 may activate one of the switches 118, 122 based on the mode of operation of the non-volatile memory 104 and may deactivate one of the switches 118, 122 based on the mode of operation of the non-volatile memory 104. For example, the voltage detector 302 may activate the switch 122 and deactivate the switch 118 upon determining that the supply voltage 114 satisfies the threshold. As another example, the voltage detector 302 may activate the switch 118 and deactivate the switch 122 upon determining that the supply voltage 114 does not satisfy the threshold.

The circuit 300 of FIG. 3 may be advantageous in an implementation of the data storage device 102 in which mode indicators are not sent from the controller 126 to the data storage device 102 and in which the host device 136 or the control circuit 120 is configured to disconnect or disable the supply voltage 114 during a standby mode of operation of the non-volatile memory 104. For example, if the host device 136 or the control circuit 120 disables the supply voltage 114 automatically in response to a period of inactivity of the non-volatile memory 104 (e.g., by monitoring the connection 109 for communications), the voltage detector 302 may detect unavailability of the supply voltage 114 and may activate the switch 118. In such configurations, the circuit 300 may enable selection between the multiple supply voltages without explicit identification of a mode of operation (e.g., without use of the mode indicator 113).

Figure 4:
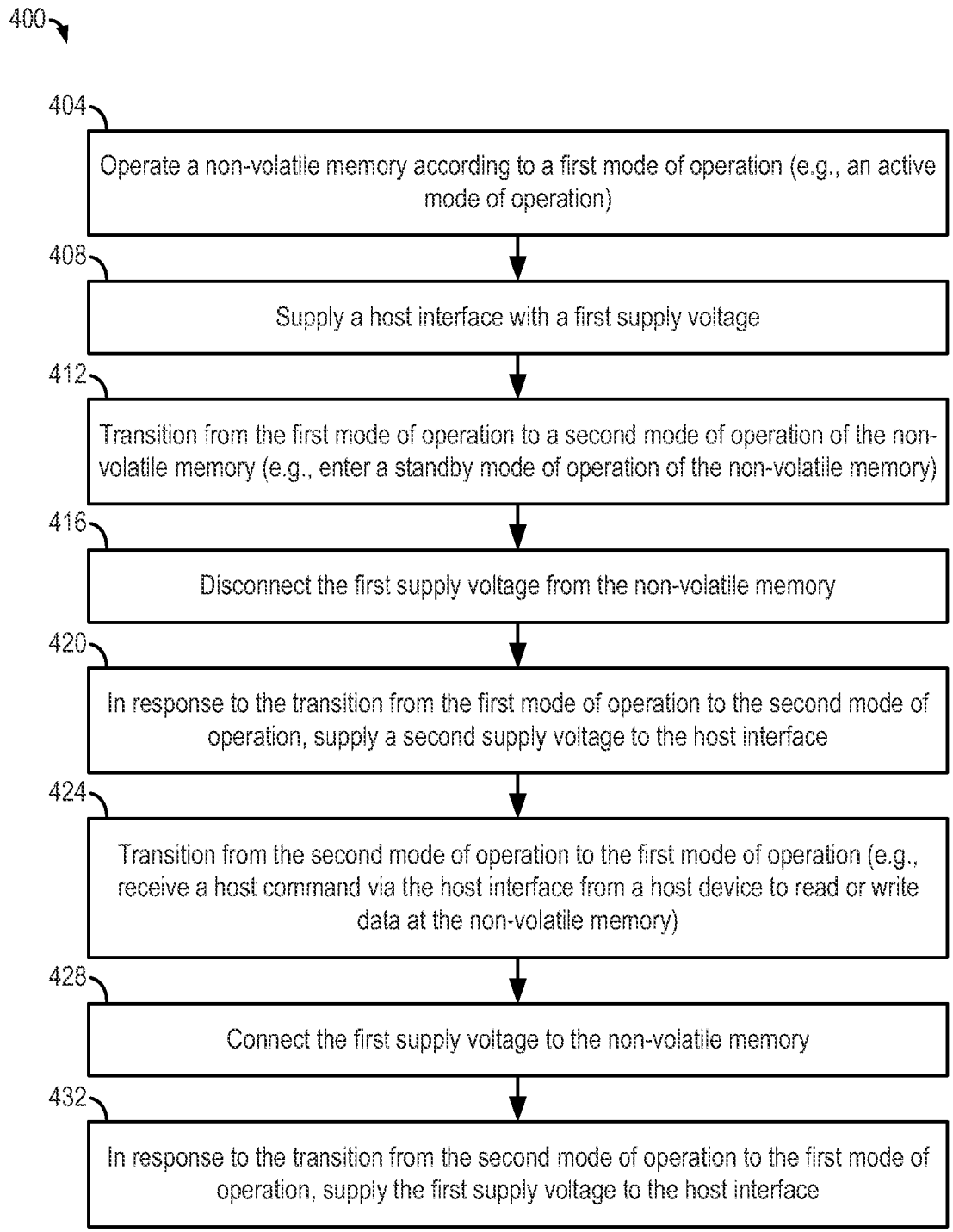
FIG. 4 is a flow diagram of a particular illustrative embodiment of a method of operation of the data storage device of FIG. 1.

Referring to FIG. 4, a particular illustrative embodiment of the method is depicted and generally designated 400. The method 400 may be performed in the data storage device 102.

The method 400 includes operating a non-volatile memory, such as the non-volatile memory 104, according to a first mode of operation, at 404. The first mode of operation may correspond to an active mode of operation, such as a mode of operation in which communications and/or data are communicated between the controller interface 106 and the memory interface 128 via the connection 109.

The method 400 further includes supplying a host interface with a first supply voltage, at 408. The host interface may correspond to the host interface 132, and the first supply voltage may correspond to a regulated supply voltage, such as the regulated supply voltage 117. The controller 126 may be configured to activate the switch 122 and to deactivate the switch 118 to supply the host interface with the regulated supply voltage 117.

The method 400 may further include transitioning from the first mode of operation to a second mode of operation of the non-volatile memory, at 412. For example, the second mode of operation may correspond to a standby mode of operation. Transitioning from the first mode of operation to the second mode of operation may include transitioning from the active mode of operation to the standby mode of operation. In a particular embodiment, the controller 126 is configured to cause the non-volatile memory 104 to enter the standby mode of operation in response to a period of inactivity, such as a lack of requests for read or write access to the non-volatile memory 104 from the host device 136. Alternatively, the controller 126 may be responsive to a command from the host device 136 instructing the data storage device 102 to operate according to the standby mode of operation. The controller 126 may issue a mode indicator, such as the mode indicator 113, indicating that the non-volatile memory 104 is to operate according to the second mode of operation.

The transition from the first mode of operation to the second mode of operation may be detected by the control circuit 120 in a manner as illustrated with reference to FIG. 2. Alternatively or in addition, the transition from the first mode of operation to the second mode of operation may be detected by the voltage detector 302 in a manner as described with reference to FIG. 3.

The method 400 may further include disconnecting the first supply voltage from the non-volatile memory, at 416. For example, the supply voltage 114 may be disconnected from the memory array 108. In a particular embodiment, the voltage detector 302 is configured to determine that the host device 136 or the control circuit 120 has disabled the supply voltage 114 based on a voltage level of the supply voltage 114 failing to satisfy a threshold.

The method 400 may further include supplying a second supply voltage to the host interface in response to the transition from the first mode of operation to the second mode of operation, at 420. The second supply voltage may correspond to an unregulated supply voltage, such as the supply voltage 112. The controller 126 may be configured to activate the switch 118 and to deactivate the switch 122 to supply the host interface with the second supply voltage.

The method 400 may further include transitioning from the second mode of operation to the first mode of operation, at 424. As a particular illustrative example, the controller 126 may receive a host command from the host device 136 via the host interface 132. The host command may request the controller 126 to read or write data at the non-volatile memory 104. The controller 126 may issue a mode indicator, such as the mode indicator 113, indicating that the non-volatile memory 104 is to operate according to the first mode of operation (e.g., an active mode of operation). The transition from the second mode of operation to the first mode of operation may be detected by the control circuit 120 in a manner as described with reference to FIG. 2. Alternatively or in addition, the transition from the second mode of operation to the first mode of operation may be detected by the voltage detector 302 in a manner as described with reference to FIG. 3.

The method 400 may further include connecting the first supply voltage to the non-volatile memory, at 428. For example, the supply voltage 114 may be connected to the memory array 108 by the control circuit 120 to terminate the standby mode of operation and to initiate the activate mode of operation.

The method 400 may further include supplying the first supply voltage to the host interface in response to the transition from the second mode of operation to the first mode of operation, at 432. For example, the controller 126 may be configured to activate the switch 122 and to deactivate the switch 118 to supply the host interface with the first supply voltage.

The method 400 may enable improved power management at the data storage device 102 while reducing noise at the host interface 132. For example, the power supply circuitry 110 may supply the host interface 132 with the regulated supply voltage 117 when the non-volatile memory 104 is to operate according to an active mode of operation in order to reduce noise associated with writing or accessing of data at the non-volatile memory 104. The host interface 132 may be supplied with the supply voltage 112 while the non-volatile memory 104 is to operate according to a standby mode of operation. Accordingly, selectively powering the host interface 132 in such a manner may reduce noise (or maintain a low noise signal) at the host interface 132 while also reducing power consumption at the data storage device 102. The method 400 may therefore improve battery life of a portable electronic device that includes a data storage device.

Although one or more components described herein are illustrated as block components and described in general terms, such components may include one or more microprocessors, state machines, or other circuits configured to enable the data storage device 102 (or one or more components thereof) to perform operations described herein. For example, one or more components described herein may correspond to one or more physical components, such as hardware controllers, state machines, logic circuits, one or more other structures, or a combination thereof, to enable the controller 126 and/or the control circuit 120 to perform one or more operations described herein. To further illustrate, the control circuit 120 may include a state machine and/or a logic circuit configured to selectively activate and deactivate the switches 118, 122. The control circuit 120 may further include a state machine and/or a logic circuit configured to disconnect or disable the supply voltage 114, such as by disconnecting a particular node of the data storage device 102 from the supply voltage 114 and connecting the particular node to a ground terminal of the data storage device 102.

For example, the control circuit 120 may include a first switch (e.g., a transistor) configured to selectively couple and decouple the particular node from the supply voltage 114. The control circuit 120 may further include a second switch (e.g., a transistor) configured to selectively couple and decouple the particular node from the ground terminal. The first switch may be responsive to a control signal generated by the control circuit 120, and the second switch may be responsive to a complement of the control signal (e.g., generated by an inverter of the control circuit 120). In another implementation, the first transistor may be a p-type metal-oxide-semiconductor field-effect transistor (pMOS-FET), and the second transistor may be an n-type metal-oxide semiconductor field-effect transistor (nMOSFET). When the control signal has a first value, the pMOSFET may couple the supply voltage 114 to the particular node, and the nMOSFET may decouple the supply voltage 114 from the particular node. When the control signal has a second value, the pMOSFET may decouple the supply voltage 114 from the particular node, and the nMOSFET may couple the supply voltage 114 to the particular node. The pMOSFET and the nMOSFET may be included in a complementary metal-oxide-semiconductor (CMOS) structure.

One or more aspects of the controller 126 and/or the control circuit 120 may be implemented using a microprocessor or microcontroller programmed to perform operations described herein, such as one or more operations of the method 400. In a particular embodiment, the controller 126 includes a processor executing instructions that are stored at the non-volatile memory 104. Alternatively or in addition, executable instructions that are executed by the processor may be stored at a separate memory location that is not part of the non-volatile memory 104, such as at a read-only memory (ROM).

To further illustrate, the controller 126 may be configured to execute instructions to cause the power supply circuitry 110 to supply the regulated supply voltage 117 to the host interface 132 during a first mode of operation of the non-volatile memory 104. For example, a processor of the controller 126 may execute instructions that cause the controller 126 to determine that the non-volatile memory 104 is to operate according to an active mode of operation and that cause the controller 126 to provide a control signal to the control circuit 120 instructing the control circuit 120 to activate the switch 122. The controller 126 may be further configured to execute instructions to cause the power supply circuitry 110 to supply the supply voltage 112 to the host interface 132 in response to a transition from the first mode of operation to a second mode of operation of the non-volatile memory 104. For example, the processor of the controller 126 may execute instructions that cause the controller to determine that the non-volatile memory 104 is to operate according to a standby mode of operation and that cause the controller 126 to provide a control signal to the control circuit 120 instructing the control circuit 120 to activate the switch 118.

In a particular embodiment, the data storage device 102 may be attached to or embedded within one or more host devices, such as within a housing of a host communication device, which may correspond to the host device 136. For example, the data storage device 102 may be integrated within a packaged apparatus such as a wireless telephone, a personal digital assistant (PDA), a gaming device or console, a portable navigation device, or other device that uses internal non-volatile memory. However, in other embodiments, the data storage device 102 may be implemented in a portable device configured to be selectively coupled to one or more external devices, such as the host device 136.

To further illustrate, the data storage device 102 may be configured to be coupled to the host device 136 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The non-volatile memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the non-volatile memory 104 may include another type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
 a non-volatile memory;
 a controller comprising core logic;
 a host interface in communication with the core logic of the controller; and
 power supply circuitry configured to:
  regulate a first supply voltage, the first supply voltage greater than a second supply voltage;
  supply the regulated first supply voltage to the host interface during an active mode of operation of the non-volatile memory; and
  in response to detecting a transition from the active mode of operation to a low-power mode of operation of the non-volatile memory, transition from supplying the regulated first supply voltage to the host interface to supplying the second supply voltage to the host interface.

2. The data storage device of claim 1, wherein the power supply circuitry is further configured to reduce noise at the host interface by regulating the first supply voltage, and wherein the second supply voltage is an unregulated supply voltage.

3. The data storage device of claim 1, wherein the low-power mode of operation is a standby mode of operation.

4. The data storage device of claim 1, wherein the power supply circuitry comprises a first switch, and wherein the power supply circuitry is further configured to activate the first switch to supply the regulated first supply voltage to the host interface in response to initiating the active mode of operation.

5. The data storage device of claim 4, wherein the power supply circuitry further comprises a second switch, and wherein the power supply circuitry is further configured to activate the second switch to supply the second supply voltage to the host interface in response to the transition from the active mode of operation to the low-power mode of operation.

6. The data storage device of claim 5, wherein the power supply circuitry further comprises a control circuit configured to deactivate the first switch and to activate the second switch.

7. The data storage device of claim 6, wherein the control circuit comprises a voltage detector that is responsive to the first supply voltage.

8. The data storage device of claim 6, wherein the controller is coupled to the non-volatile memory, and wherein the control circuit is responsive to a mode indicator sent from the controller to the non-volatile memory indicating the transition from the active mode of operation to the low-power mode of operation.

9. The data storage device of claim 1, wherein the power supply circuitry comprises a regulator, and wherein the regulator is configured to generate the regulated first supply voltage.

10. The data storage device of claim 9, wherein the regulator is responsive to an unregulated supply voltage, and wherein the regulator is further configured to track the unregulated supply voltage to generate the regulated first supply voltage.

11. The data storage device of claim 1, wherein the host interface is compliant with a universal flash storage (UFS) communication protocol.

12. A device comprising:
 a non-volatile memory;
 a controller comprising logic circuitry coupled to a host interface;
 a regulator configured to regulate a first supply voltage, the first supply voltage greater than a second supply voltage;
 a first switch coupled to a first voltage supply and to the host interface, the first switch configured, when activated, to provide the regulated first supply voltage from the regulator to the host interface;
 a second switch coupled to a second voltage supply and to the host interface, the second switch configured, when activated, to provide the second supply voltage from the second voltage supply to the host interface; and
 a control circuit configured to:
  activate the first switch during an active mode of operation of the non-volatile memory; and
  in response to detecting a transition from the active mode of operation to a low-power mode of operation of the non-volatile memory, transition from activating the first switch to activating the second switch.

13. The device of claim 12, wherein the control circuit is further configured to deactivate the first switch during the transition.

14. A method comprising:
in a data storage device comprising a non-volatile memory and a controller that comprises logic circuitry and a host interface in communication with the logic circuitry, performing:
regulating a first supply voltage, the first supply voltage greater than a second supply voltage;
supplying the regulated first supply voltage to the host interface during an active mode of operation of the non-volatile memory; and
in response to a transition from the active mode of operation to a low-power mode of operation of the non-volatile memory, transitioning from supplying the regulated first supply voltage to the host interface to supplying the second supply voltage to the host interface.

15. The method of claim 14, wherein the second supply voltage is an unregulated supply voltage.

16. The method of claim 14, wherein a voltage level of the regulated first supply voltage is approximately equal to a voltage level of the second supply voltage to reduce a transition noise associated with switching between the regulated first supply voltage and the second supply voltage.

17. The method of claim 14, wherein the low-power mode of operation is a standby mode of operation of the non-volatile memory.

18. The method of claim 14, further comprising:
initiating the active mode of operation; and
in response to initiating the active mode of operation, activating a first switch to supply the regulated first supply voltage to the non-volatile memory.

19. The method of claim 18, further comprising:
in response to the transition from the active mode of operation to the low-power mode of operation:
deactivating the first switch; and
activating a second switch to supply the second supply voltage to the non-volatile memory,
wherein deactivating the first switch and activating the second switch are performed by a control circuit of the data storage device.

20. The method of claim 19, wherein the control circuit comprises a voltage detector that is responsive to the first supply voltage.

21. The method of claim 19, wherein the controller is coupled to the non-volatile memory, and wherein the control circuit is responsive to a mode indicator sent from the controller to the non-volatile memory indicating the transition from the active mode of operation to the low-power mode of operation.

22. The method of claim 14, wherein the data storage device further comprises a regulator that regulates the first supply voltage, and wherein the host interface complies with a universal flash storage (UFS) communication protocol.

* * * * *